United States Patent [19]
Yokoyama

[11] Patent Number: 4,727,335
[45] Date of Patent: Feb. 23, 1988

[54] GAIN-CONTROLLED AMPLIFIER

[75] Inventor: Kenji Yokoyama, Hamamatsu, Japan

[73] Assignee: Nippon Gakki Seizo Kabushiki Kaisha, Ahizuoka, Japan

[21] Appl. No.: 908,331

[22] Filed: Sep. 17, 1986

[30] Foreign Application Priority Data

Sep. 19, 1985 [JP] Japan .................. 60-143076[U]

[51] Int. Cl.⁴ .................. H03F 3/45; H03G 3/10
[52] U.S. Cl. .................. 330/254; 330/257
[58] Field of Search .................. 330/254, 257; 358/27, 358/174

[56] References Cited

U.S. PATENT DOCUMENTS 4,331,929 5/1982 Yokoyama .................. 330/254

FOREIGN PATENT DOCUMENTS 46313 4/1981 Japan .................. 330/254

*Primary Examiner*—James B. Mullins
*Attorney, Agent, or Firm*—Darby & Darby

[57] ABSTRACT

A gain-controlled amplifier amplifies an input signal at a gain which varies exponentially in accordance with a control voltage applied thereto and selectively outputs one of non-inverted and inverted output signals substantially identical in characteristic with each other. The gain-controlled amplifier comprises first and second transistor pairs, a common emitter driving circuit and a subtracting circuit. The first transistor pair comprises first and second transistors, and the second transistor pair comprises third and fourth transistors. The emitters of each of the transistor pairs are joined together, and bases of the first and third transistors and bases of second and fourth transistors are joined together, respectively. The two sets of joined bases serve as input terminals of the control voltage. The common emitter driving circuit complementalily drives each of the joined emitters in accordance with the input signal of the amplifier. Connected to the collectors of the first and third transistors and the collectors of the second and fourth transistors are a current-mirror circuit and resistors, respectively, as loads. A current is supplied to the collector of the first transistor in accordance with the input signal. The subtracting circuit subtracts a signal appearing at a collector of one of the second and fourth transistors from a signal appearing at a collector of the other of the second and fourth transistors, and outputs the subtraction result as the output signal of this amplifier.

7 Claims, 3 Drawing Figures

GAIN-CONTROLLED AMPLIFIER

BACKGROUND OF THE INVENTION (a) Field of the Invention

The present invention relates to a gain-controlled amplifier whose gain varies exponentially in response to a linear voltage variation of a control voltage applied to the amplifier.

(b) Description of the Prior Art

FIG. 1 shows one conventional gain-controlled amplifier 100. The amplifier 100 comprises an input terminal T1 to which an input signal Vi is applied, an output terminal T2 for outputting an output signal Vo, and a control-voltage terminal T3 to which a control voltage Vc is applied. The amplifier 100 further comprises operational amplifiers 101 and 102, current-mirror circuits 103 and 104, pairs of NPN transistors 105, 106 and 107 emitters of each of which are connected to each other. A gain Av of the amplifier 100 is expressed by the following equation when the resistance value of the input resistor 108 is R1 and when the resistance value of the feed back resistor 109 is R2:

$$Av = (R2/R1) \cdot \exp(-K \cdot Vc) \qquad (1)$$

where $K = q/kT$, and wherein k is Boltzmann's constant, q is an electric charge of an electron, and T the junction temperature represented in absolute temperature.

With the structure of the above-described conventional gain-controlled amplifier 100, however, a balanced output comprising two output signals identical in characteristic and 180° out of phase from each other can not be obtained. For example, the amplifier 100 only outputs an output signal which is in phase with the input signal. And therefore, if an inverted output signal is necessary, the output terminal T2 of the amplifier 100 must be connected to an input terminal of an inverting amplifier 110 as shown in FIG. 2.

However, in such configuration as shown in FIG. 2, the degration of the output signal by the operational-amplifier 102 and that of the output signal by the inverting amplifier 110 differ from each other.

SUMMARY OF THE INVENTION

It is therefore an object of the present invention to provide a gain-controlled amplifier which can produce a balanced output comprising two output signals which are identical in characteristic and 180° out of phase from each other.

According to an aspect of the present invention, there is provided a gain-controlled amplifier for amplifying an input signal at a gain which is controlled by a control voltage applied thereto comprising an input terminal for receiving an input signal; an output terminal for outputting an output signal; a first bipolar transistor pair having first and second transistors of which emitters are connected to each other, the control voltage being applied between bases of the first and second transistors; means for supplying a current to a collector of the first transistor, the current corresponding to the input signal; a second bipolar transistor pair having third and fourth transistors of which emitters are connected to each other, the control voltage being appllied between bases of the third and fourth transistors; a current-mirror circuit connected to the collector of the first transistor and a collector of the third transistor as loads; first and second resistors having the same resistance and connected to collectors of the second and fourth transistors as loads, respectively; a common emitter driving circuit for complementarily driving both common emitters of the first and second bipolar transistor pairs in accordance with the input signal; and a subtracting circuit means for subtracting a signal appearing at the collector of one of the second and fourth transistors from a signal appearing at the collector of the other of the second and fourth transistors, the subtracting circuit means outputting a subtraction result to the output terminal as the output signal.

DESCRIPTION OF THE PREFERRED EMBODIMENT OF THE INVENTION

Figure 1:
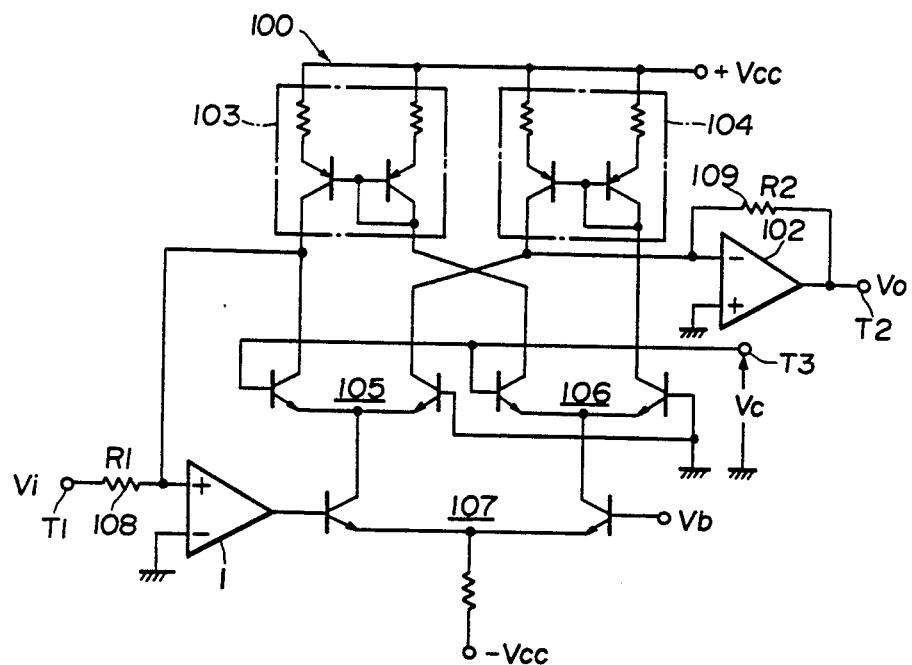
FIG. 1 is a schematic circuit diagram of a prior-art gain-controlled amplifier.
Figure 2:
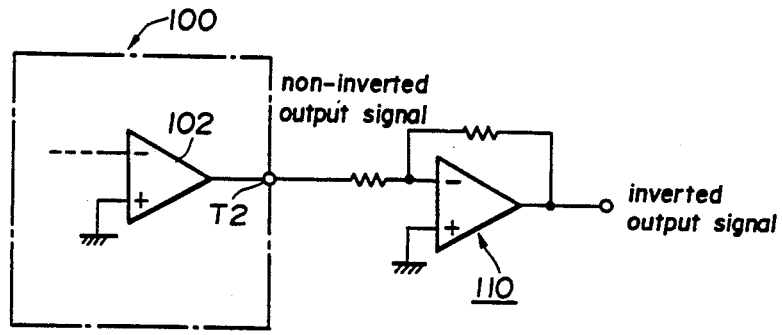
FIG. 2 is a schematic circuit diagram of another prior-art gain-controlled amplifier which is capable of outputting inverted and non-inverted output signals.
Figure 3:
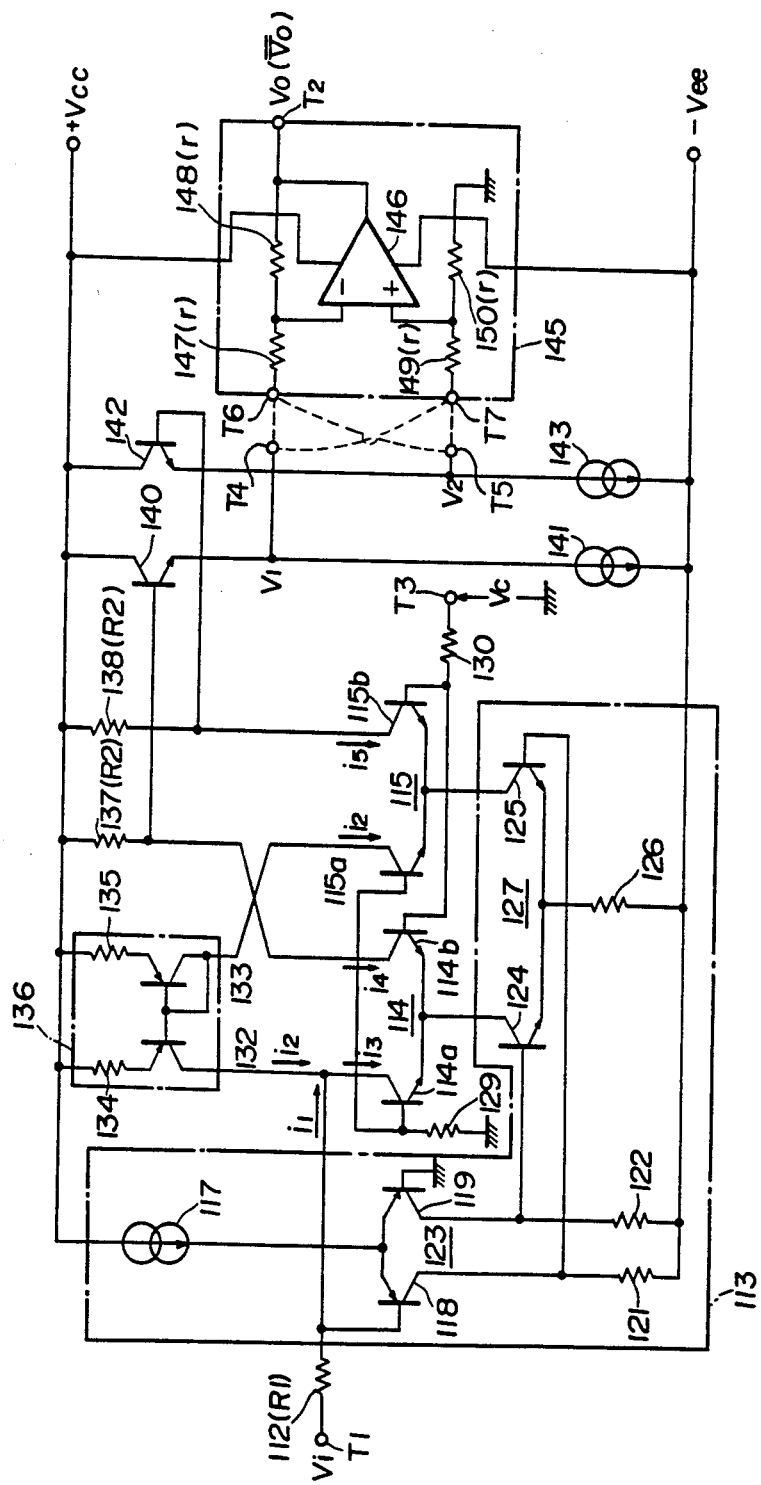
FIG. 3 is a schematic circuit diagram of a gain-controlled amplifier according to one embodiment of the present invention.

FIG. 3 shows a circuit diagram of one embodiment of a gain-controlled amplifier according to the invention.

In FIG. 3, T1 designates an input terminal, 112 an input resistor (value is R1), 113 a driving circuit for driving a common emitter of a first transistor pair 114 which comprises first and second transistors 114a and 114b and a common emitter of a second transistor pair 115 which comprises third and fourth transistors 115a and 115b.

The common emitter driving circuit 113 is provided for complementarily driving the transistor pairs 114 and 115 in accordance with the input signal Vi, and comprises a constant current circuit 117, differential amplifier 123 including transistors 118 and 119 and resistors 121 and 122, and a differential amplifier 127 consisting of transistors 124 and 125 and a resistor 126. The differential amplifier 127 amplifies each of differential outputs of the differential amplifier 123. The base of the transistor 118 is connected to the input terminal T1 through the input resistor 112, and each collectors of the transistors 124 and 125 are connected to the common emitters of the transistor pairs 114 and 115, respectively. The bases of the transistors 114a and 115a are connected to each other and also connected to the ground through a resistor 129. The bases of the transistors 114b and 115b are connected to each other and connected to a control voltage terminal T3 through a resistor 130. A control voltage Vc is applied to the terminal T3. The collectors of the transistors 114a and 115a are connected to a current-mirror circuit 136 which comprises transistors 132 and 133 and resistors 134 and 135. The collector of the transistor 114a is also connected to the input terminal T1 through the resistor 112. Resistors 137 and 138 each having a value of R2 are connected to the collectors of the transistors 114b and 115b as loads, respectively. A transistor 140 and a constant current circuit 141 constitute a buffer amplifier having a gain of 1, and a transistor 142 and a constant current circuit 143 constitute another buffer amplifier having a gain of 1. These buffer amplifiers amplify signals from the collectors of the transistors 114b and 115b and output the amplified signals from terminals T4 and T5.

Shown at 145 in FIG. 3 is a subtracter which comprises an operational amplifier 146 and resistor 147 to 150 (values are all r). Input terminals T6 and T7 of this subtracter 145 are connected respectively to the terminals T4 and T5 or T5 and T4. The subtracter 145 outputs an output signal Vo from an output terminal T2.

The operation of the embodiment thus constructed will now be described.

In the case where a current $i_1$ flows from the input terminal T1 through the resistor 112, the following formula (2) is obtained:

$$Vi = R1 \cdot i_1 \qquad (2)$$

And, when collector currents of the transistors 132 and 114a are $i_2$ and $i_3$, the following formula (3) is obtained:

$$i_1 = i_3 - i_2 \qquad (3)$$

When the amount of the collector current of the transistor 132 is $i_2$, the amount of the collector current of the transistor 115a is also $i_2$ by the effect of the current-mirror circuit 136. Taking the amounts of collector currents of the transistors 114b and 115b as $i_4$ and $i_5$, respectively, the relation between these collector currents and the control voltage Vc can be expressed by the following formulas (4) and (5) according to the characteristics of the P-N junction of each of the transistors 114a, 114b, 115a and 115b:

$$i_4 = i_3 \cdot \exp(K \cdot Vc) \qquad (4)$$

$$i_5 = i_2 \cdot \exp(K \cdot Vc) \qquad (5)$$

On the other hand, output voltages $V_1$ and $V_2$ at the terminals T4 and T5 are expressed by the following formulas (6) and (7):

$$V_1 = Vcc - R2 \cdot i_4 \qquad (6)$$

$$V_2 = Vcc - R2 \cdot i_5 \qquad (7)$$

where Vcc is a positive power supply voltage of this gain-controlled amplifier.

When the terminals T4 and T5 are connected respectively to the terminals T6 and T7, the output signal Vo is expressed by the following formula (8):

$$Vo = V_2 - V_1 \qquad (8)$$

The following formula (9) is obtained by substituting the formulas (6) and (7) for the formula (8):

$$Vo = R_2 \cdot (i_4 - i_5) \qquad (9)$$

Also, the following formula (10) is obtained by substituting the formulas (4) and (5) for the formula (9):

$$Vo = R_2 \cdot (i_3 - i_2) \cdot \exp(K \cdot Vc) \qquad (10)$$

On the other hand, by substituting the formula (3) for the formula (2), the following formula (11) can be obtained:

$$Vi = R_1 \cdot (i_3 - i_2) \qquad (11)$$

And therefore, the gain Av of the amplifier of FIG. 3 can be obtained from the above formulas (10) and (11) as follows:

$$Av = Vo/Vi = (R2/R1) \cdot \exp(K \cdot Vc) \qquad (12)$$

This formula (12) clearly indicates that the voltage gain Av of the amplifier of FIG. 3 is exponentially changed with the change of control voltage Vc.

Thus, in the case where the terminals T4 and T5 are connected respectively to the terminals T6 and T7, the amplifier shown in FIG. 3 operates as a non-inverting amplifier whose gain varies expornentially in accordance with the control voltage Vc.

On the other hand, in the case where the terminals T4 and T5 are connected respectively to the terminals T7 and T6, the following formula (13) is obtained:

$$Vo = V_1 - V_2 \qquad (13)$$

And, the gain Av is expressed by the following formula (14):

$$Av = -(R2/R1) \cdot \exp(K \cdot Vc) \qquad (14)$$

Therefore, the amplifier shown in FIG. 3 operates as an inverting amplifier.

With the amplifier of FIG. 3, a non-inverted output signal Vo and an inverted output signal $\overline{Vo}$ can selectively be obtained by simply changing the inputs to the subtracting circuit 145. In this case, the remaining circuit portions of the amplifier of FIG. 3 need not be changed. Therefore, with the amplifier of FIG. 3, the non-inverted output signal Vo and the inverted output signal $\overline{Vo}$ substantially identical in characteristics to each other. As a result, there is little difference between the degradation of the non-inverted output signal Vo and that of the inverted output signal $\overline{Vo}$ in the higher frequency range.

When it is necessary to obtain both of the non-inverted and inverted output signals Vo and $\overline{Vo}$, an additional subtracter identical in structure to the subtracter 145 is provided. In this case, input terminals T6 and T7 of this additional subtracter are connected to the terminals T4 and T5 in the inversed relation to those of the subtracter 145. With this arrangement, addition of the subtracter does not adversely affect the gain-controlled amplifier, since the signals to be supplied to this subtracter are voltages. In this case, however, the additional subtracter should use an operational amplifier identical in characteristic to the operational amplifier 146.

As described above, with the gain-controlled amplifier according to the invention, non-inverted and inverted output signals identical in characteristics can be obtained with a simple construction.

What is claimed is:

1. A gain-controlled amplifier for amplifying an input signal at a gain which is controlled by a control voltage applied thereto comprising:
   an input terminal for receiving an input signal;
   an output terminal for providing an output signal;
   a first bipolar transistor pair having first and second transistors, the emitters of which are connected to each other, the control voltage being applied between bases of said first and second transistors;
   means for supplying a current to a collector of said first transistor, said current corresponding to the input signal;
   a second bipolar transistor pair having third and fourth transistors, the emitters of which are connected to each other, the control voltage being applied between bases of said third and fourth transistors;

a current-mirror circuit connected to said collector of said first transistor and a collector of said third transistor as loads;

first and second resistors having the same resistance and connected to collectors of said second and fourth transistors as loads, respectively;

a common emitter driving circuit for complementarily driving both common emitters of said first and second bipolar transistor pairs in accordance with the input signal; and subtracting circuit means for subtracting a signal appearing at said collector of one of said second and fourth transistors from a signal appearing at said collector of the other of said second and fourth transistors, said subtracting circuit means providing a subtraction result to the output terminal as the output signal.

2. A gain-controlled amplifier according to claim 1, wherein said means for supplying a current to said collector of said first transistor comprises a resistor connected between the input terminal and said collector of said first transistor.

3. A gain-controlled amplifier according to claim 1, wherein said current-mirror circuit comprises fifth and sixth bipolar transistors whose bases are connected to each other and connected to the collector of one of said fifth and sixth transistors, a third resistor connected between an emitter of said fifth transistor and a first power supply and a fourth resistor connected between an emitter of said sixth transistor and said first power supply, collectors of said fifth and sixth transistors being connected to said collectors of said first and third transistors.

4. A gain-controlled amplifier according to claim 1, wherein said common emitter driving circuit comprises first and second additional bipolar transistors whose emitters are connected together, collectors of said first and second additional transistors being connected respectively to said common emitters of said first and second transistor pairs, bases of said first and second additional transistors being complementarily driven in accordance with the input signal.

5. A gain-controlled amplifier according to claim 4, wherein said common emitter driving circuit further comprises a first differential amplifier having third and fourth additional bipolar transistors, the emitters of which are connected to each other, said emitters of said third and fourth additional transistors being supplied with a current from a constant current circuit, collectors of said third and fourth additional transistors being connected to said bases of said first and second additional transistors.

6. A gain-controlled amplifier according to claim 1, further comprising buffer amplifier means for feeding said signals appearing at said collectors of said second and fourth transistors to said subtracting circuit means, said buffer amplifier means comprising first and second supplementary transistors and two constant current sources for causing constant currents to flow through emitters of said first and second supplementary transistors connected to said collectors of said second and fourth transistors, signals appearing at said emitters of said first and second supplementary transistors being supplied to said subtracting circuit means.

7. A gain-controlled amplifier according to claim 1, further comprising a first buffer for amplifying said signal appearing at the collector of said second transistor to output an amplified signal from a first terminal and a second buffer for amplifying said signal appearing at the collector of said fourth transistor to output an amplified signal from a second terminal, and wherein said subtracting circuit means comprises a third terminal for being selectively connected to one of said first and second terminals, a fourth terminal for being selectively connected to the other of said first and second terminals, third and fourth additional resistors having the same resistance and serially connected between said third terminal and said output terminal, fifth and sixth additional resistors identical in resistance value to said third and fourth additional resistors and serially connected between said fourth terminal and ground, and an operational amplifier having inverting and non-inverting inputs, the inverting input terminal being connected to a junction point of said third and fourth additional resistors, the non-inverting input terminal of said operational amplifier being connected to a junction point of said fifth and sixth additional resistors, an output terminal of said operational amplifier being connected to said output terminal whereby the characteristics of the output signal will be either in phase or 180° out of phase depending on the selected connections with signal characteristics which are otherwise identical for either connection.

* * * * *